( 12 ) United States Patent
Deniau et al.

(10) Patent No.: US 9,743,548 B2
(45) Date of Patent: Aug. 22, 2017

(54) HOUSING FOR AT LEAST ONE ELECTRONIC CARD

(71) Applicant: ENENSYS TECHNOLOGIES, Cesson Sevigne (FR)

(72) Inventors: Eric Deniau, Cesson Sevigne (FR); Laurent Roul, Cesson Sevigne (FR); Jacques Sisomsack, Cesson Sevigne (FR)

(73) Assignee: ENENSYS TECHNOLOGIES, Cesson Sevigne (FR)

( * ) Notice: Subject to any disclaimer, the term of this patent is extended or adjusted under 35 U.S.C. 154(b) by 0 days.

(21) Appl. No.: 15/102,344

(22) PCT Filed: Nov. 28, 2014

(86) PCT No.: PCT/EP2014/075911
§ 371 (c)(1),
(2) Date: Jun. 7, 2016

(87) PCT Pub. No.: WO2015/086340
PCT Pub. Date: Jun. 18, 2015

(65) Prior Publication Data
US 2016/0324028 A1    Nov. 3, 2016

(30) Foreign Application Priority Data

Dec. 11, 2013   (FR) ...................................... 13 62402

(51) Int. Cl.
*H05K 7/02*  (2006.01)
*H05K 7/14*  (2006.01)
(Continued)

(52) U.S. Cl.
CPC ........... *H05K 7/1418* (2013.01); *G06F 1/186* (2013.01); *H01R 12/71* (2013.01); *H05K 5/03* (2013.01);
(Continued)

(58) Field of Classification Search
CPC ...... H05K 7/1418; H05K 5/03; H05K 7/1427; H05K 7/1487; G06F 1/186; H01R 12/71
See application file for complete search history.

(56) References Cited

U.S. PATENT DOCUMENTS 6,166,917 A * 12/2000 Anderson ............... G06F 1/186
361/752
6,198,633 B1 * 3/2001 Lehman ................... G06F 1/18
312/332.1
(Continued)

FOREIGN PATENT DOCUMENTS

WO    2010/138824 A2   12/2010

OTHER PUBLICATIONS

Mar. 17, 2015 Search Report issued in International Patent Application No. PCT/EP2014/075911.

*Primary Examiner* — Robert J Hoffberg
*Assistant Examiner* — Hung Dang
(74) *Attorney, Agent, or Firm* — Oliff PLC; R. Brian Drozd

(57) ABSTRACT

Housing for an electronic card includes a chassis that has a base, a cover, and an insertion wall. The base has a female element and a pocket. The electronic card can be introduced/extracted through a window of the insertion wall. The electronic card also includes guide walls, each including: a guide groove to receive the electronic card; a male element to cooperate with the female element; a tongue disposed at an end of the guide wall oriented on a side opposing the insertion wall and forming an arm having a stud to be inserted in the pocket; a clip disposed at the guide wall end and forming an elastic blade with a tooth oriented towards the base, and a face of the blade is oriented towards the cover and is designed to abut the latter; and a backplane electronic card to be inserted between the blade and the arm.

7 Claims, 4 Drawing Sheets

Figure 1:
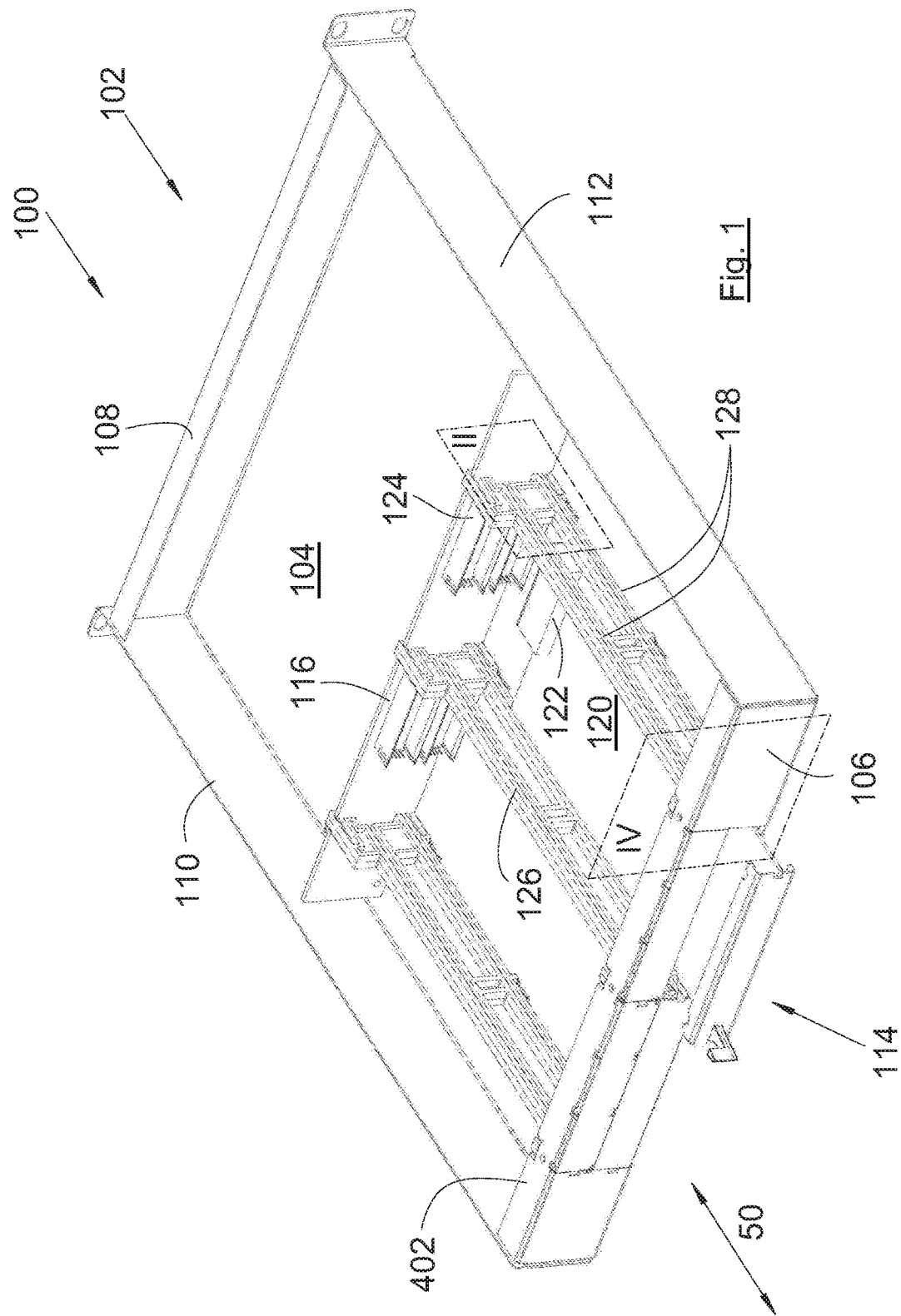

(51) Int. Cl.
*G06F 1/18* (2006.01)
*H01R 12/71* (2011.01)
*H05K 5/03* (2006.01)

(52) U.S. Cl.
CPC ......... *H05K 7/1427* (2013.01); *H05K 7/1487* (2013.01)

(56) References Cited

U.S. PATENT DOCUMENTS

| | | | | |
|---|---|---|---|---|
| 6,580,616 | B2* | 6/2003 | Greenside | H05K 7/1425 361/752 |
| 6,999,319 | B2* | 2/2006 | Wu | G06F 1/184 174/555 |
| 7,099,160 | B1* | 8/2006 | Ice | H05K 7/1418 211/41.17 |
| 7,210,586 | B2* | 5/2007 | Ice | H05K 7/1404 211/26 |
| 7,374,259 | B2* | 5/2008 | Wu | G06F 1/181 312/223.2 |
| 9,442,537 | B2* | 9/2016 | Tsai | H05K 7/1487 |
| 2010/0124473 | A1 | 5/2010 | Hoshino et al. | |
| 2012/0243178 | A1 | 9/2012 | Zhang et al. | |
| 2013/0220952 | A1* | 8/2013 | Zhou | G11B 33/128 211/26 |

* cited by examiner

HOUSING FOR AT LEAST ONE ELECTRONIC CARD

The present invention relates to a housing for at least one electronic card.

A housing for electronic cards, intended for example to be mounted in a rack cabinet of a computer server, comprises a chassis, generally made from metal, inside which numerous components are fixed: electronic cards, electrical supplies, guide rails, etc.

The components are generally fixed by clamping screws. Such assembly proves to be lengthy and tedious and requires the use of numerous mechanical components (screws, bolts, inserts) to ensure correct holding of the components.

The object of the present invention is to propose a housing for at least one electronic card that does not have the drawbacks of the prior art and which in particular affords strong, rapid and easy fitting and fixing of the electronic cards in the chassis without fixing screws.

To this end, a housing is proposed for at least one electronic card having a connector, said housing comprising:
  a chassis having:
    a base having at least one female element and at least one pocket,
    a cover, and
    an insertion wall having, for the or each electronic card, a window through which said electronic card can be introduced into or extracted from the chassis in a translation direction,
  for the or each electronic card, two guide walls, each comprising, for the or each electronic card, a guide groove oriented parallel to the translation direction and intended to receive said electronic card,
  each guide wall comprising:
    at least one male element designed to cooperate with a female element by insertion of said male element in said female element,
    a tongue disposed at the end of the guide wall oriented on the side opposite to the insertion wall, taking the form of an arm having, at its free end, a stud designed to be inserted in a pocket,
    a clip disposed at the end of the guide wall oriented on the side opposite to the insertion wall and taking the form of an elastic blade provided at its free end with a tooth oriented towards the base, and the face of the blade that is oriented towards the cover being designed to come into abutment against the latter, and
  a backplane electronic card extending parallel to the plane of the insertion wall, having a receiving connector designed to be coupled to said connector, and designed to be inserted between the blade and the arm.

Advantageously, each female element takes the form of a deep drawing of the base towards the inside of the chassis with an opening oriented on the side opposite to the insertion wall, and each male element takes the form of a bar issuing from the guide wall, disposed under the latter and oriented towards the insertion wall.

Advantageously, the backplane electronic card has, along at least one of its two edges parallel to the base, at least one scallop designed for housing a blade or an arm therein.

Advantageously, the insertion wall has a fold extending parallel above the base and having, for each guide wall, a deep drawing towards the inside of the chassis having a groove parallel to the translation direction and emerging at the free end of the fold and in which there slides an extension of said guide wall that has, for each edge of the groove of the deep drawing, a groove in which said groove of the deep drawing is housed.

Advantageously, the electronic card is associated with one or two holding and extraction systems, each comprising a female hollow produced on the side of the guide wall, and a lever mounted so as to be able to rotate on the electronic card about a rotation axis perpendicular to the plane of the electronic card, and a handle of which projects outwards, the lever having a tooth oriented outwards and intended to be inserted in the female hollow under the effect of a means forming a spring.

Advantageously, the means forming a spring takes the form of a tongue disposed downstream of the tooth facing the end of the guide wall.

Advantageously, the lever comprises a wall forming a stop against which said tongue comes into abutment when the electronic card is extracted.

Figure 2:
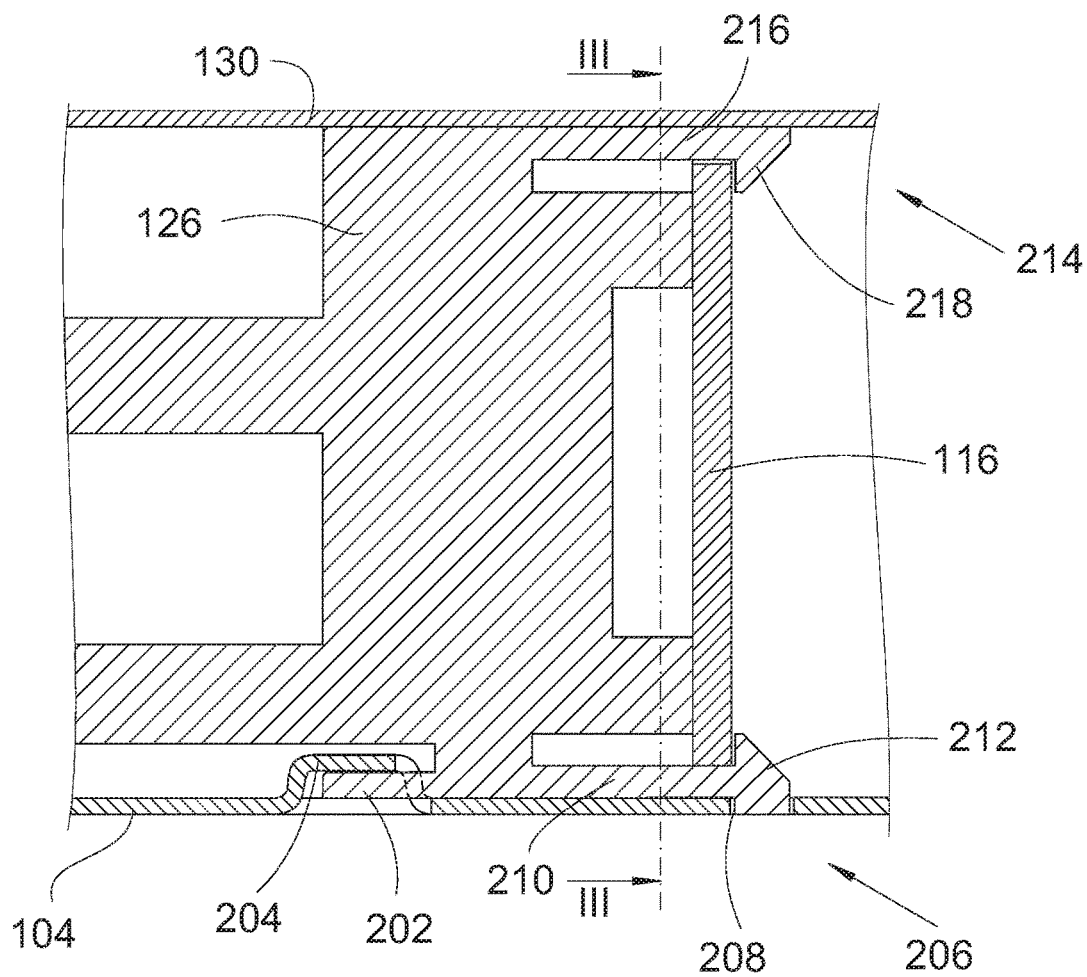
Figure 3:
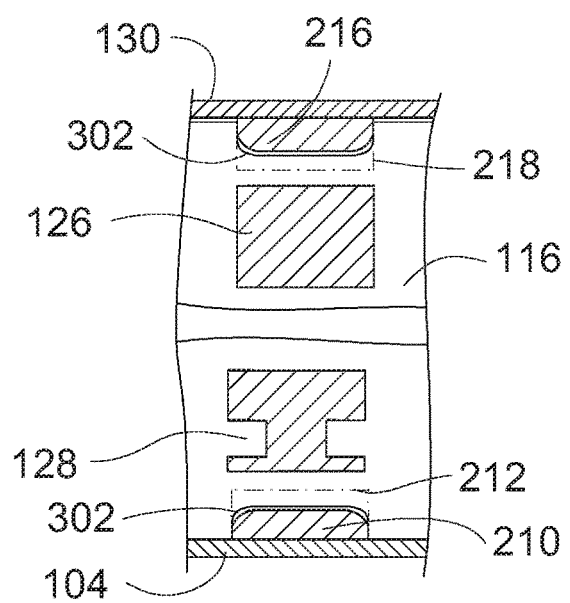
Figure 4:
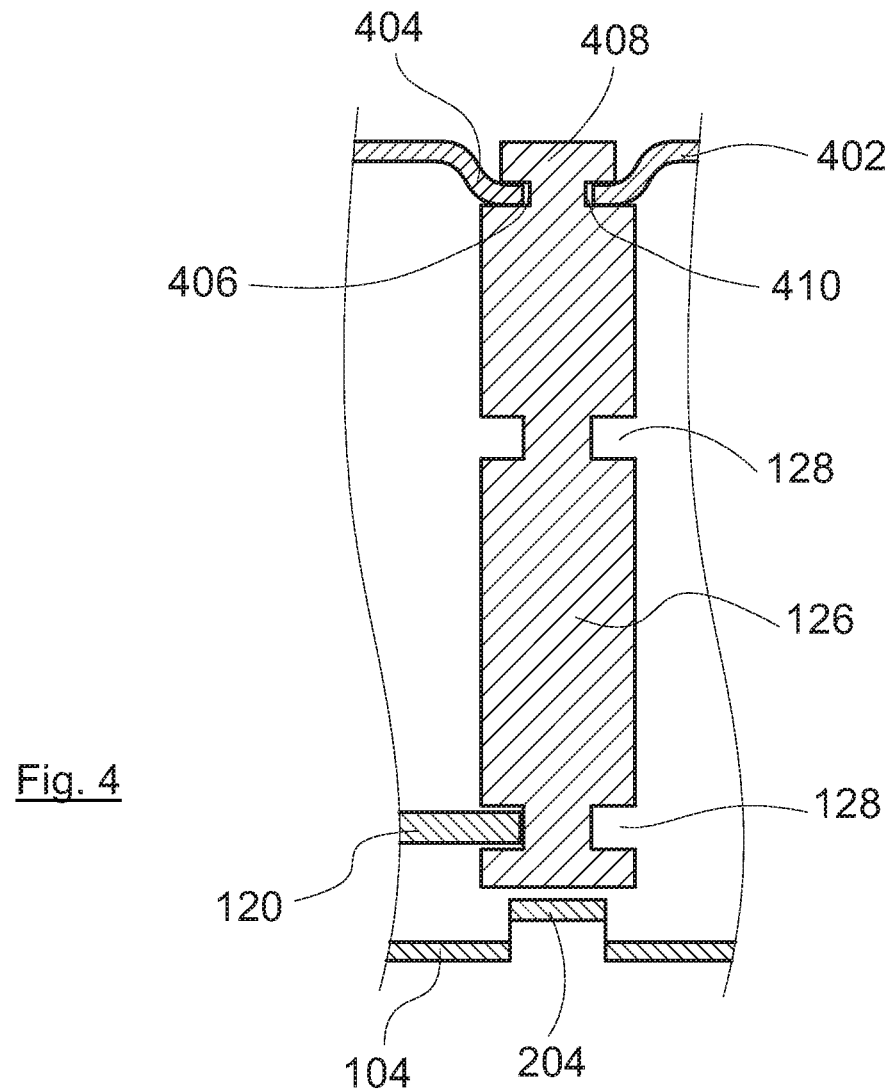
Figure 5:
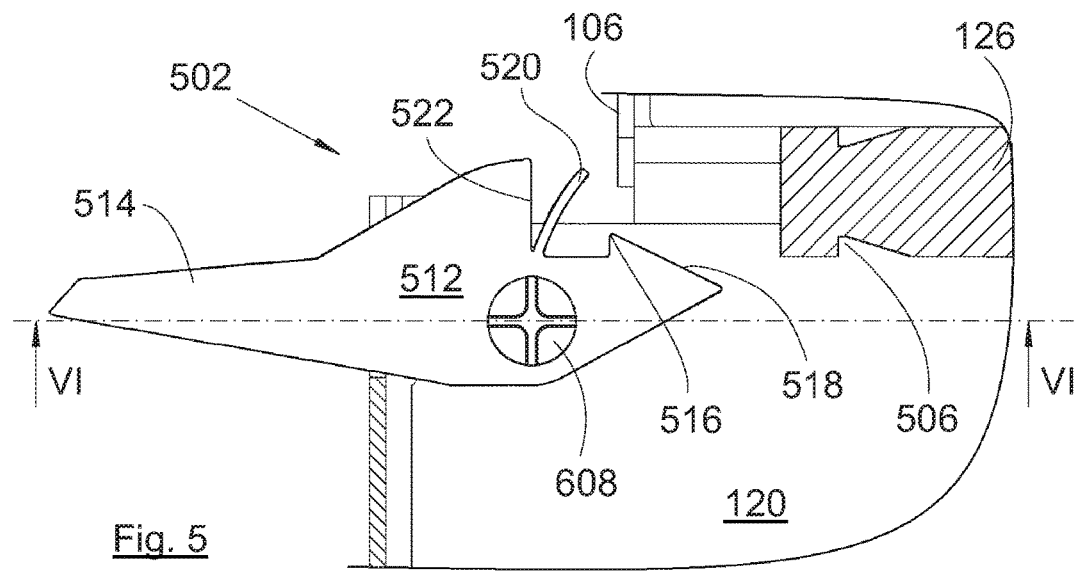
Figure 6:
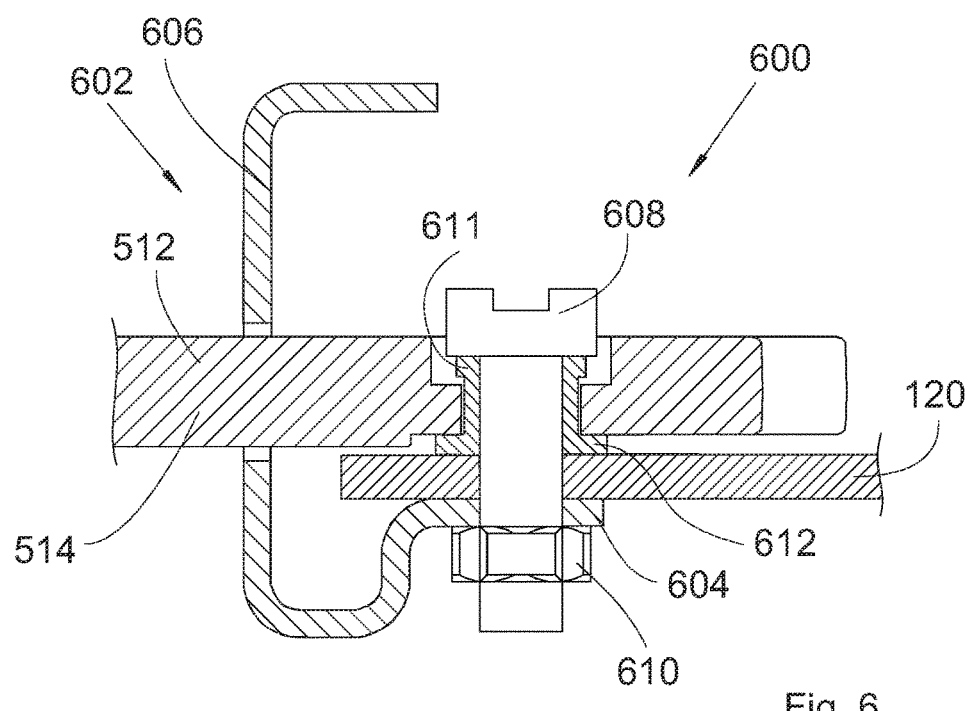

The features of the invention mentioned above, as well as others, will emerge more clearly from a reading of the following description of an example embodiment, said description being given in relation to the accompanying drawings, among which:

FIG. 1 is a perspective view of a housing according to the invention for at least one electronic card, FIG. 2 is a cross section along the plane H in FIG. 1, FIG. 3 is a cross section along the line in FIG. 2, FIG. 4 is a cross section along the plane IV in FIG. 1, FIG. 5 is a plan view of a detail of the housing according to the invention, and FIG. 6 is a cross section along the straight line VI-VI in FIG. 5.

FIG. 1 shows a housing 100 for at least one electronic card 120. In the embodiment of the invention presented in FIG. 1, there is one electronic card 120, but provision is made for being able to place more than one.

The housing 100 comprises a chassis 102 that has a base 104, an insertion wall 106, which is here the rear wall, and a cover 130 (FIGS. 2 and 3).

In the embodiment of the invention presented in FIG. 1, the chassis 102 also comprises a front wall 108 and two lateral walls 110 and 112.

The chassis 102 thus forms a closed cell inside which the electronic cards 120 are housed.

For each electronic card 120, the insertion wall 106 has a window 114 through which said electronic card 120 is introduced into or extracted from the chassis 102 in a translation direction 50 perpendicular to the plane of the insertion wall 106.

Each electronic card 120 has a connector 122 that is fixed along the edge of said electronic card 120 that is introduced first through the window 114, that is to say here the edge that is oriented on the side opposite to the insertion wall 106.

When the electronic card 120 is introduced, the connector 122 is coupled to the receiving connector 124, which is fixed to a backplane electronic card 116 that extends parallel to the plane of the insertion wall 106 and perpendicular to the base 104 and is held in the chassis 102.

The housing 100 also comprises guide walls 126 that are fixed in the chassis 102 and more particularly to the base 104. Each guide wall 126 extends from the insertion wall 106 to the backplane electronic card 116 in a plane perpendicular to the base 104 and perpendicular to the plane of the insertion wall 106, that is to say parallel to the translation direction 50.

Each electronic card 120 is disposed between two guide walls 126 that each comprise, for said electronic card 120, a guide groove 128. Each guide groove 128 extends parallel to the base 104 and therefore parallel to the translation direction 50 and is intended to receive one of the two edges of the electronic card 120 that is oriented parallel to the translation direction 50.

Thus, when the electronic card 120 is introduced into or extracted from the chassis 102, said electronic card 120 is guided by the two guide grooves 128 of the adjacent guide walls 126 in which its two edges are inserted.

In the embodiment of the invention presented in FIG. 1, there are three guide walls 126, each having, on either side of the guide wall 126, two guide walls 128 one above the other. Thus, for each pair of guide walls 126, it is possible to guide two electronic cards 120 placed one above the other.

Naturally, it is possible to provide more than two guide grooves 128 per guide wall 126, and therefore more generally at least one.

Each guide wall 126 is produced from a rigid electrically insulating material such as for example Nylon.

FIG. 2 shows a cross section of the guide wall 126 in the vicinity of the backplane electronic card 116 and FIG. 4 shows the guide wall 126 in the vicinity of the insertion wall 106.

To fix the guide wall 126, it comprises, distributed over its length, at least one male element 202, and the base 104 has at least one female element 204. Each female element 204 is designed to cooperate with a male element 202 by insertion of said male element 202 in said female element 204 in order to fix the guide wall 126 to the base 104.

Each female element 204 takes the form of a deep drawing of the base 104 towards the inside of the chassis 102 with an opening oriented on the side opposite to the insertion wall 106, that is to say here towards the front wall 108.

Each male element 202 takes the form of a bar issuing from the guide wall 126, disposed under the latter and oriented towards the insertion wall 106.

Thus, by sliding the guide wall 126 from the inside of the chassis 102, towards the insertion wall 106, each male element 202 is housed in a female element 204 by passing through its opening.

In order to lock the guide wall 126 in translation after it is fitted, the latter comprises a tongue 206 disposed at the end of the guide wall 126 that is oriented on the side opposite to the insertion wall 106, that is to say here towards the front wall 108, and the base 104 has a pocket 208. The tongue 206 is designed to be inserted in the pocket 208 and thus lock the guide wall 126.

The tongue 206 takes here the form of an arm 210 having a stud 212 at its free end, and the stud 212 is placed in the pocket 208.

In order to lock the tongue 206, the backplane electronic card 116 comes into abutment against the face of the arm 210 that is oriented on the side opposite to the base 104, that is to say here towards the cover 130. The arm 210 is thus sandwiched between the base 104 and the backplane electronic card 116.

The backplane electronic card 116 comes into abutment against the end of the guide wall 126 and is held, on the base 106 side, by the stud 212 that extends on either side of the arm 210 and, on the cover 130 side, by a clip 214.

The clip 214 is disposed at the end of the guide wall 126 oriented on the side opposite to the insertion wall 106 and takes the form of an elastic blade 216 provided at its free end with a tooth 218 oriented towards the base 104.

The positioning of the backplane electronic card 116 consists of sliding an edge of said backplane electronic card 116 between the end of the guide wall 126 and the stud 212, pivoting the backplane electronic card 116 about said edge thus placed, and bringing the opposite edge of the backplane electronic card 116 between the end of the guide wall 126 and the tooth 218, which is designed to move away when this edge passes by flexing of the blade 216. The backplane electronic card 116 is thus sandwiched between the blade 216 and the arm 210 and between the guide wall 126 and the tooth 218 on the one hand and the stud 212 on the other hand.

To prevent the backplane electronic card 116 becoming free, the cover 130 comes into abutment against the face of the blade 116 that is oriented towards it and which is thus sandwiched between the backplane electronic card 116 and the cover 130.

Thus, after closure of the cover 130, the guide wall 126 and the backplane electronic card 116 are perfectly held even when electronic cards 120 are subsequently fitted, and this without any additional mechanical element.

FIG. 3 is a cross section along the line in FIG. 2.

To hold the backplane electronic card 116 in position in the direction perpendicular to the translation direction 50, the backplane electronic card 116 has, along its two edges parallel to the base 104, at least one scallop 302 intended to house one of the blades 216 or one of the arms 210.

The scallop 302 in the edge of the backplane electronic card 116 that is oriented towards the base 104 makes it possible to house an arm 210, and the scallop 302 on the edge of the backplane electronic card 116 that is oriented towards the cover 130 makes it possible to house a blade 216. Just one of these conditions is sufficient to hold the backplane electronic card 116 in position.

In the embodiment of the invention for which each blade 216 and each arm 210 (there are three of each here), the backplane electronic card 116 has a scallop 302, that is to say three scallops 302 along the edge oriented towards the base 104 and three scallops 302 along the edge oriented towards the cover 130.

Thus, when the backplane electronic card 116 is fitted, each arm 210 and each blade 216 are each housed in a scallop 302 and the stud 212, or respectively the tooth 218 which projects beyond the arm 210, or respectively from the blade 216 towards the inside of the chassis 102, projects from the scallop 302 (broken lines 212 and 218 in FIG. 3) and comes into abutment against the backplane electronic card 116.

FIG. 4 shows a cross section of the housing 100 along the plane IV in FIG. 1 in the vicinity of the insertion wall 106.

To providing holding of each guide wall 126 with respect to the insertion wall 106, the latter has a fold 402 that extends parallel to and above the base 104 and the fold 402 has, for each guide wall 126, a deep drawing 404 towards the inside of the chassis 102, that is to say here towards the base 104, having a groove 406 parallel to the translation direction 50 and emerging at the free end of the fold 402 and in which there slides an extension 408 of said guide wall 126 that has, for each edge of the groove 406 of the deep drawing 404, a groove 410 in which said groove 406 of the deep drawing 404 is housed.

FIG. 5 is a plan view of an electronic card 120 and shows a holding and extraction system 502 that improves the holding of an electronic card 120 in the chassis 102 and facilitates the extraction thereof.

There are one or two holding and extraction systems 502 per electronic card 120. When there are two holding and extraction systems 502, each is disposed at one of the corners of the electronic card 120 that is in the vicinity of the insertion wall 106.

FIG. 6 is a cross section of FIG. 5 along the line VI-VI and shows an equipped electronic card 600.

The equipped electronic card 600 comprises the electronic card 120, a screen 602 having a base 604 and a flank 606 secured to the base 604 and a bolt 608, 610.

The base 604 is parallel to the electronic card 120 and is pressed against a face of the electronic card 120, and the screw 608 of the bolt is screwed into the nut 610 of the bolt, passing successively through the electronic card 120 and the base 604, thus sandwiching the electronic card 120 between the base 604 and the screwhead 608 or a strut as explained below.

It should be understood that the nut 610 can also be a thread produced in the base 604.

The flank 606 extends perpendicular to the base 104 and to the plane of the electronic card 120 and stands in for the window 114 through which the electronic card 120 is inserted or extracted in order to close it off.

The holding and extraction system 502 comprises a female hollow 506 produced on the side of the guide wall 126 and a lever 512 mounted so as to be able to rotate on the electronic card 120 about a rotation axis perpendicular to the plane of the electronic card 120 and a handle 514 of which projects from the insertion wall 106 and from the flank 606 towards the outside.

In the embodiment of the invention in FIGS. 5 and 6, the lever 512 has the screw 608 passing through it and is held by it, and the rotation axis is the axis of the screw 608.

The lever 512 has a tooth 516 oriented outwards and intended to be inserted in the female hollow 506 under the effect of a means forming a spring 520 in order to hold the equipped electronic card 600 in position.

In the insertion direction, the upstream part of the tooth 516 has a plane 518 aslant with respect to the translation direction 50, which comes into abutment against the end of the guide wall 126 in order to retract the tooth 516 when the electronic card 120 is introduced into the chassis 102 by rotation of the lever 512 (here in the clockwise direction), until the tooth 516 reaches the female hollow 506, in which it is housed under the effect of the means forming a spring 520.

The means forming a spring here takes the form of a tongue 520 disposed downstream of the tooth 516 facing the end of the guide wall 126 and, when a force is applied to said tongue 520 in a direction opposite to the direction of introduction of the electronic card 120, said tongue 520 tends to pivot the lever 512 so as to make the tooth 516 emerge outwards (here in the anticlockwise direction).

When the equipped electronic card 600 is introduced into the chassis 102 and after the tooth 516 has passed beyond the free end of the guide wall 126, the tongue 520 progressively comes into abutment against said end of the guide wall 126, which tends to make the tooth 516 emerge and therefore to press it in the bottom of the female hollow 506.

To extract the equipped electronic card 600 from the chassis 102, the lever 512 is rotated (here in the anticlockwise direction) so as to extract the tooth 516 from the female hollow 506, stressing the tongue 520 a little more, which comes into abutment against a wall 522 of the lever 512, which extends substantially perpendicular to the translation direction 50. The tongue 520 is then sandwiched between the wall 522 forming a stop and the end of the guide wall 126, and the continuation of the rotation of the lever 512 causes the tongue 520 and the wall 522 forming a stop to be put in abutment against the guide wall 126 and causes extraction of the equipped electronic card 600.

In order to provide an easier rotation of the lever 512, the holding and extraction system 502 comprises a cylindrical strut 611 coaxial with the screw 608. The strut 611 is positioned in abutment against the electronic card 120, passes through the lever 512 and receives the head of the screw 608. The strut 611 also has here a collar 612 that extends between the electronic card 120 and the lever 512 in order to separate the lever 512 from the electronic card 120.

The holding and extraction system 502 may also be used in the context of a housing different from that of the invention.

Naturally the present invention is not limited to the examples and embodiments described and depicted but is capable of numerous variants accessible to a person skilled in the art.

The invention claimed is:

1. A housing for at least one electronic card having a connector, said housing comprising:
   a chassis having:
      a base having at least one female element and at least one pocket,
      a cover, and
      an insertion wall having, for the or each electronic card, a window through which said electronic card can be introduced into or extracted from the chassis in a translation direction,
   for the or each electronic card, two guide walls, each comprising, for the or each electronic card, a guide groove oriented parallel to the translation direction and intended to receive said electronic card, each guide wall comprising:
   at least one male element designed to cooperate with a female element by insertion of said male element in said female element,
   a tongue disposed at an end of the guide wall oriented on the side opposite to the insertion wall, taking a form of an arm having, at its free end, a stud designed to be inserted in a pocket,
   a clip disposed at the end of the guide wall oriented on the side opposite to the insertion wall and taking a form of an elastic blade provided at its free end with a tooth oriented towards the base, and a face of the blade that is oriented towards the cover being designed to come into abutment against the latter, and
   a backplane electronic card extending parallel to a plane of the insertion wall, having a receiving connector designed to be coupled to said connector, and designed to be inserted between the blade and the arm.

2. The housing according to claim 1, wherein each female element takes a form of a deep drawing of the base towards the inside of the chassis with an opening oriented on the side opposite to the insertion wall, and wherein each male element takes a form of a bar issuing from the guide wall, disposed under the latter and oriented towards the insertion wall.

3. The housing according to claim 1, wherein the backplane electronic card has, along at least one of its two edges parallel to the base, at least one scallop designed for housing a blade or an arm therein.

4. The housing according to claim 1, wherein the insertion wall has a fold extending parallel above the base and having, for each guide wall, a deep drawing towards the inside of the chassis having a groove parallel to the translation direction and emerging at a free end of the fold and in which there slides an extension of said guide wall that has, for each edge of the groove of the deep drawing, a groove in which said groove of the deep drawing is housed.

5. The housing according to claim 1, wherein the electronic card is associated with one or two holding and extraction systems, each comprising a female hollow produced on a side of the guide wall, and a lever mounted so as to be able to rotate on the electronic card about a rotation axis perpendicular to the plane of the electronic card, and a handle of which projects outwards, the lever having a tooth oriented outwards and intended to be inserted in the female hollow under the effect of a means forming a spring.

6. The housing according to claim 5, wherein the means forming a spring takes the form of a tongue disposed downstream of the tooth facing the end of the guide wall.

7. The housing according to claim 6, wherein the lever comprises a wall forming a stop, against which said tongue comes into abutment when the electronic card is extracted.

* * * * *